United States Patent
Robinson et al.

(10) Patent No.: US 7,146,144 B2
(45) Date of Patent: Dec. 5, 2006

(54) FREQUENCY AGILE EXCITER

(75) Inventors: Ian Robinson, Venice, CA (US); Jack Macek, Torrance, CA (US); Frank Winter, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 441 days.

(21) Appl. No.: 10/689,296

(22) Filed: Oct. 20, 2003

(65) Prior Publication Data

US 2005/0085194 A1 Apr. 21, 2005

(51) Int. Cl.
*H04B 7/00* (2006.01)
*H04B 1/06* (2006.01)
*H04B 1/26* (2006.01)

(52) U.S. Cl. ............ 455/260; 455/255; 455/313; 455/323; 341/143; 341/144; 375/222

(58) Field of Classification Search ........ 455/260, 455/255, 256, 276.1, 293, 313, 323, 334, 455/341; 341/143, 144, 111, 155; 375/222; 370/480

See application file for complete search history.

(56) References Cited

U.S. PATENT DOCUMENTS

| | | | |
|---|---|---|---|
| 5,451,949 A | 9/1995 | Gundry | |
| 5,512,897 A | 4/1996 | Wilson et al. | |
| 6,291,924 B1 | 9/2001 | Lau et al. | |
| 6,373,418 B1 * | 4/2002 | Abbey | 341/143 |
| 6,400,759 B1 * | 6/2002 | Liu et al. | 375/222 |
| 6,442,195 B1 * | 8/2002 | Liu et al. | 375/220 |
| 6,462,689 B1 | 10/2002 | Wong et al. | |
| 6,538,592 B1 | 3/2003 | Yang et al. | |
| 6,563,448 B1 | 5/2003 | Fontaine | |
| 6,809,669 B1 * | 10/2004 | Robinson | 341/131 |
| 6,842,129 B1 * | 1/2005 | Robinson | 341/143 |
| 6,963,297 B1 * | 11/2005 | Robinson et al. | 341/143 |
| 2002/0110189 A1 | 8/2002 | Souissi et al. | |
| 2002/0120457 A1 | 8/2002 | Oliveira et al. | |

* cited by examiner

*Primary Examiner*—Tony T. Nguyen
(74) *Attorney, Agent, or Firm*—Tarolli, Sundheim, Covell & Tummino LLP (57) ABSTRACT

Systems and methods are provided for providing high dynamic range operation over a variable range of frequencies. A delta-sigma modulator, having associated frequency characteristics, produces a digital output signal. A digital-to-analog converter converts the digital output signal into an analog signal. A clock circuit provides a clock signal to the delta-sigma modulator and the digital-to-analog converter. A frequency control controls one or more of the clock circuit, the delta-sigma modulator, and the digital-to-analog converter to alter the frequency characteristics of the delta-sigma modulator. A filter circuit can provide one or more passbands to one or more downstream amplifiers ensuring that out of band quantization noise is removed before amplification.

27 Claims, 8 Drawing Sheets

FIG. 8

FREQUENCY AGILE EXCITER

TECHNICAL FIELD

The present invention relates generally to communications systems, and more specifically to signal transmitters.

BACKGROUND OF THE INVENTION

Efforts in the design of integrated circuits for radio frequency (RF) communication systems generally focus on improving performance, reducing cost or a combination thereof. One area of increasing interest relates to conversion of signals, such as from analog-to-digital or digital-to-analog. Both types of conversion have benefited from the development and use of delta-sigma modulation.

Delta-sigma modulation is a technique used to generate a coarse estimate of a signal using a small number of quantization levels and a very high sampling rate. Limiting a signal to a finite number of levels introduces "quantization" noise into the system. Oversampling and the use of an integrator feedback-loop in delta-sigma modulation are effective in shifting quantization noise to out-of-band frequencies. The noise shifting properties enable efficient use of subsequent filtering stages to remove noise and produce a more precise representation of the input.

The use of delta-sigma modulation in a digital-to-analog conversion can produce an analog signal having a high dynamic range, but only for limited ranges of frequency. Outside of a narrow frequency band having a high dynamic range, the delta-sigma modulation produces significant quantization noise. In effect, the delta-sigma modulator trades the majority of its spectral range for a few regions of high dynamic range operation. The out-of-band quantization noise produced by the delta-sigma modulation requires an analog filter to attenuate all frequencies outside of the narrow low-noise bands.

While delta-sigma modulators have been useful in digital-to-analog conversion applications dealing with a narrow band of frequencies, frequency hopping and multi-frequency applications have required a wide-band, convention, digital-to-analog converter to achieve necessary spectral coverage. The performance of existing digital-to-analog converters using delta-sigma modulators, referred to hereinafter as a delta-sigma DACs, simply degrades too quickly to be useful outside of its narrow spectral band. Delta-sigma DACs possess a number of desirable characteristics, such as a high dynamic range and the ability to directly produce radio frequency signals, that would make them useful for these applications. The present invention enhances the utility of delta-sigma DACs, enabling them to support a wider range of frequencies and in turn support multi-band and multi-standard transmitters.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

In accordance with one aspect of the present invention, a frequency agile exciter assembly provides high dynamic range operation over a variable range of frequencies. A delta-sigma modulator, having associated frequency characteristics, produces a digital output signal. A digital-to-analog converter converts the digital output signal into an analog signal. A clock circuit provides a clock signal to the delta-sigma modulator and the digital-to-analog converter. A frequency control controls one or more of the clock circuit, the delta-sigma modulator, and the digital-to-analog converter to alter the frequency characteristics of the delta-sigma modulator.

In accordance with another aspect of the present invention, a digital frequency synthesizer having frequency agility is provided. A digital-to-analog converter receives a digital input signal and outputs an analog signal having an associated frequency. A tunable filter, having at least one passband with a respective central frequency, filters the analog output signal. A frequency control controls the respective central frequencies of the at least one passband.

In accordance with yet another aspect of the present invention, a method is provided for providing a frequency agile delta-sigma digital-to-analog converter. At least one frequency characteristic associated with a delta-sigma modulator is altered. A tunable filter is configured to an appropriate passband according to the frequency characteristics of the delta-sigma modulator.

DETAILED DESCRIPTION OF INVENTION

The present invention relates to systems and methods for varying frequency characteristics of an exciter. In accordance with one or more aspects of the invention, the exciter can include a digital-to-analog converter (DAC) having one or more variable frequency characteristics. For example, the center frequency and shape of one or more regions of high-dynamic range associated with the DAC can be altered at a central frequency control to allow for changing input frequencies. In an exemplary embodiment, the DAC is a delta-sigma DAC (e.g., a DAC that operates on a delta-sigma modulated signal). In accordance with an aspect of the invention, the exciter can further include a tunable filter for attenuating noise outside of a desired range of frequencies.

The methods and systems described herein are generally useful in exciters, but are also applicable to multi-carrier applications and within the field of direct digital synthesis.

Figure 1:
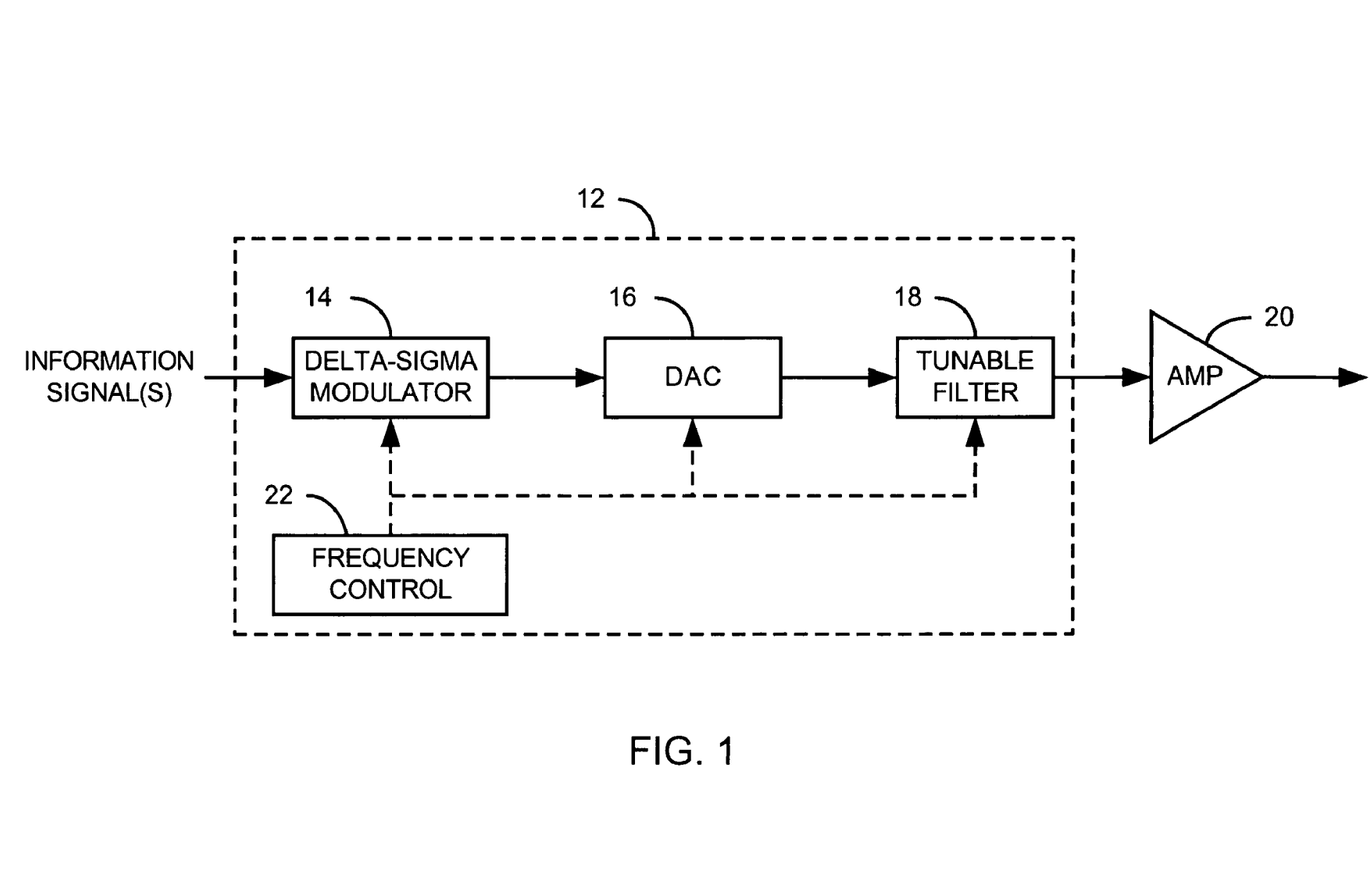
FIG. 1 illustrates a functional block diagram of a transmitter system comprising a tunable exciter in accordance with one aspect of the invention.

FIG. 1 illustrates a transmitter system 10 comprising a tunable exciter 12 in accordance with one aspect of the invention. The exciter 12 receives one or more digital information signals at a delta-sigma modulator 14. The signals are input into the delta-sigma modulator 14 as a multi-bit input stream at a first sample rate. The delta-sigma modulator 14 converts the multi-bit input stream into an output stream at a second sample rate. The second sample rate can be selected according to desired frequency characteristics of an analog output signal associated with the system.

The output stream is provided to a digital-to-analog converter (DAC) 16. The digital-to-analog converter 16 converts the digital output stream into one or more analog signals, each having a characteristic frequency associated with the second sample rate. In an exemplary embodiment, the characteristic frequency is a radio frequency, such that the analog signal can be broadcast without any change in frequency. By radio frequency, it is intended to encompass the range of feasible transmission frequencies, including both traditional radio frequency (RF) ranges (e.g., megahertz range) and microwave frequency ranges (e.g., gigahertz range). The characteristic frequency can, however, be an intermediate frequency, requiring one or more upconverters (not shown) within the exciter to convert the intermediate frequency signal to an appropriate frequency for transmission.

It will be appreciated that the output of the delta-sigma modulator can contain a considerable amount of quantization noise. For example, a delta-sigma modulator transforming a twelve-bit output into a one-bit output will generate a large amount of quantization noise. One of the purposes of the delta-sigma modulator 14 is to shape the noise in a desired fashion. For example, much of the noise can be shifted to frequencies well outside a narrow frequency band of interest. Once the noise has been shifted away from the narrow frequency band of interest, it can be removed from the signal without undue impact on the frequency band of interest.

To this end, the analog signals are then provided to a tunable filter 18. The tunable filter 18 has one or more characteristic passbands with associated center frequencies. The filter allows signals having a frequency falling within the passbands to pass through in approximately their original state, but attenuates signals having a frequency falling outside of the passbands. It will be appreciated that one or more of the passbands of the tunable filter 18 can be arranged to coincide with the frequency band of interest for the delta-sigma modulator 14 and DAC 16. Thus, the out-of-band quantization noise can be filtered from the signal, and the filtered signal can be provided to an amplifier 20 for transmission.

A problematic characteristic of delta-sigma modulation is the narrow range of frequencies produced by a delta-sigma modulator. The quality of a delta-sigma modulated signal degrades quickly as it diverges from a narrow, high dynamic range band associated with the delta-sigma modulator. Thus, while the delta-sigma provides a signal having a high dynamic range over its associated band, it is effectively limited to this narrow band of frequencies.

In accordance with an aspect of the present invention, each of the delta-sigma modulator 14, the DAC 16, and the tunable filter 18 can be controlled by a frequency control 22. The frequency control 22 is operative to change one or more frequency characteristics of at least one of the delta-sigma modulator 14, the DAC 16, and the tunable filter 18 to provide a frequency agile exciter 12. For example, the frequency control can alter a characteristic center frequency or shape of a high dynamic range frequency band associated with the delta-sigma modulator 14. The frequency control 22 can comprise a microprocessor running customized software, a specialized digital or analog signal processor, or any of a number of other signal evaluation components. The frequency control 22 can receive input from a user as configuration input or frequency information can be passed to the frequency control from components upstream of the delta-sigma modulator (not shown).

The frequency control 22 allows the exciter 12 to dynamically adjust to a number of different frequencies by adjusting the frequency band of one or more components. For example, the frequency control can change clock rates associated with the delta-sigma modulator 14 and the DAC 16 to change the frequency characteristics of the one or more high dynamic range frequency bands associated with the delta-sigma modulator 14 and the DAC 16. The passband frequencies of the tunable filter 18 can also be changed by the frequency control 22 to match a desired output frequency of the DAC 16. These changes can occur in real time, allowing the exciter 12 to be used for frequency hopping and frequency division schemes.

Figure 2:
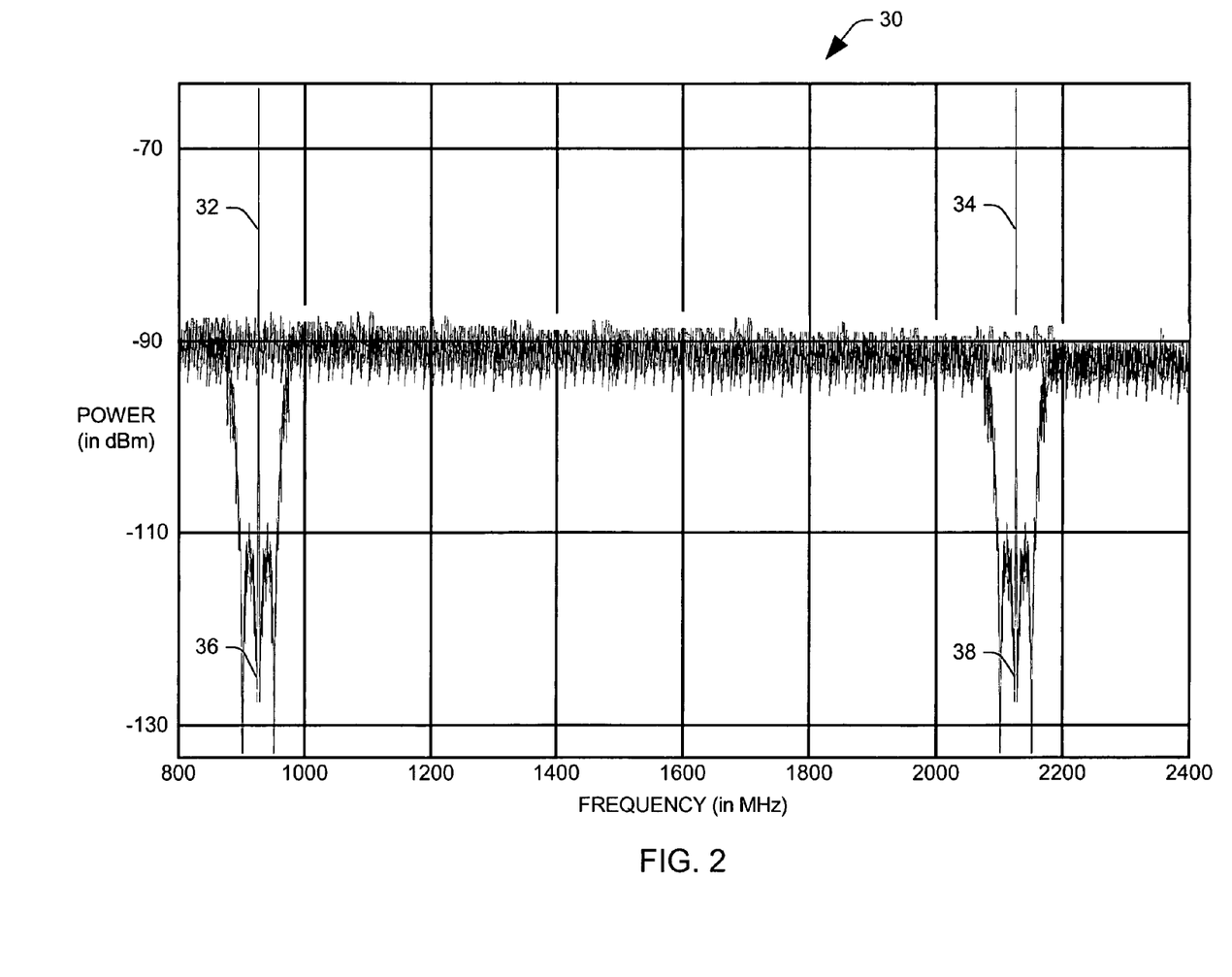
FIG. 2 is a graph of an analog output signal in which power is plotted as a function of frequency for the analog output of a frequency-agile delta-sigma DAC implemented in accordance with an aspect of the present invention.

FIG. 2 is a graph 30 of an analog output signal in which power (dBm) is plotted as a function of frequency (MHz) for the analog output of a frequency-agile delta-sigma DAC implemented in accordance with an aspect of the present invention. The signal is shown at a first time as a first line 32 drawn in black and at a second time as a second line 34 drawn in gray. As mentioned previously, a delta-sigma DAC according to an aspect of the present invention can provide a very low noise region (e.g., 36) of the spectrum, which is particularly useful for wireless communications applications. By providing for frequency agile operation of the delta-sigma DAC, a delta-sigma DAC can support multi-band and multi-standard transmitters.

At a first time, corresponding to the first line 32, the signal is operating in a GSM band. For this example, a low noise region 36 associated with the analog signal is centered at about 940 MHz. The low noise region 36 extends for a bandwidth ranging from about 30 MHz to about 100 MHz around the center frequency. In accordance with an aspect of the present invention, the center frequency of the signal can be changed, such that the signal at a second time, corresponding to the second line 34, is operating in a WCDMA frequency band. Thus, a low noise region 38 associated with the signal is now centered at about 2135 MHz. For the purpose of example, only the center frequency of the passband has been changed in the illustrated graph. It will be appreciated, however, that the width and power of the low noise region can also be changed in accordance with the present invention.

Figure 3:
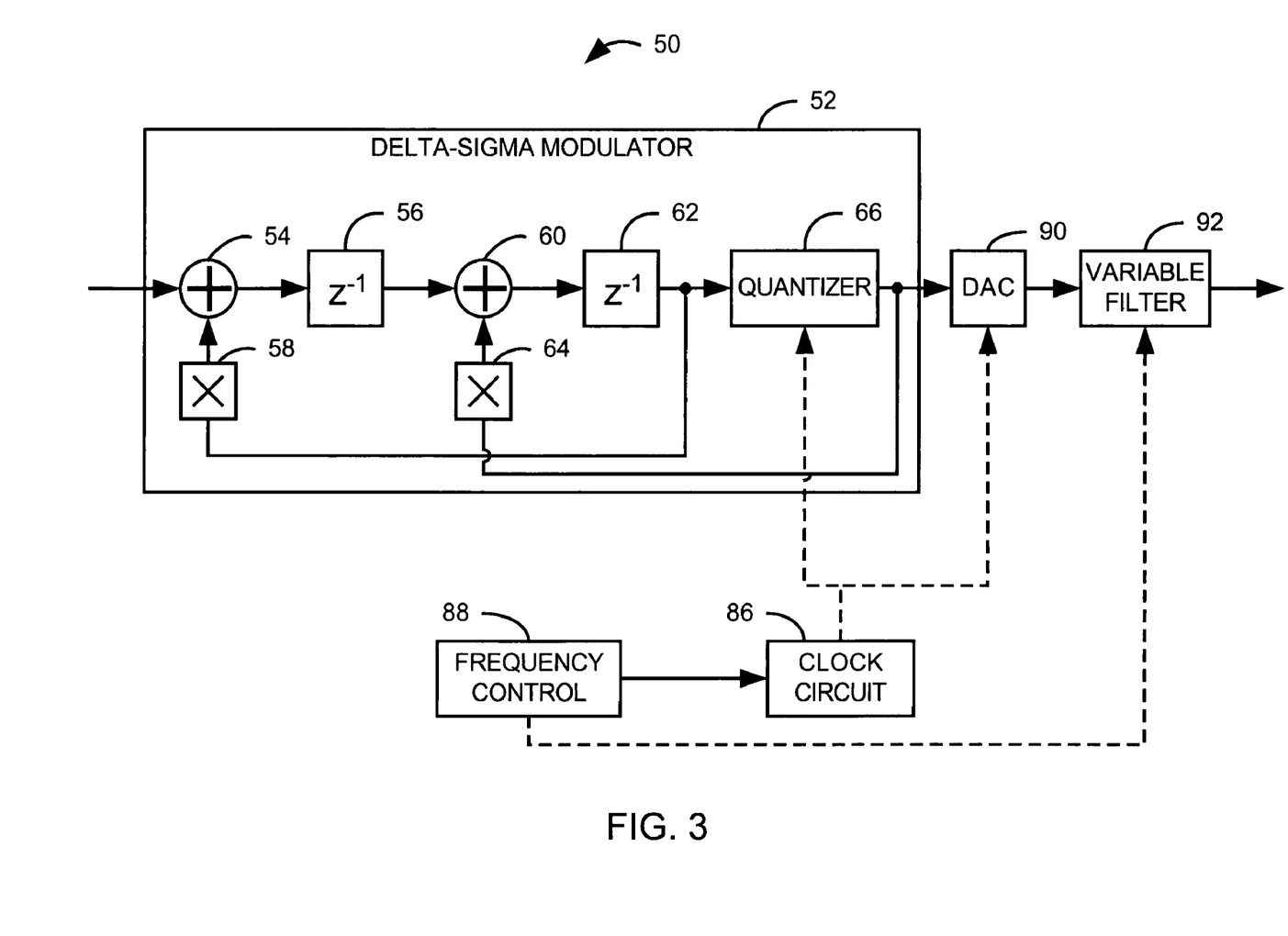
FIG. 3 illustrates a functional block diagram of an exemplary embodiment of an tunable exciter in accordance with an aspect of the present invention.

FIG. 3 illustrates a functional block diagram of an exemplary tunable exciter 50 in accordance with an aspect of the present invention. The exciter 50 comprises a delta-sigma modulator 52 that receives a digital input signal at a first word size and sample rate, and outputs a modulated output signal having a second word size and sample rate. In the illustrated example, the first word size is twelve bits and the second word size is one bit. It will be appreciated that the digital input signal can be oversampled to produce an output signal at an increased rate, or frequency. For example, the delta-sigma modulator 52 and a digital-to-analog converter 90 can process the oversampled input signal at a high rate to directly produce radio frequency output without the need for upconversion of the signal.

The delta-sigma modulator 52 can comprise one or more stages, limited only by practical considerations. The delta-sigma modulator 52 quantizes the input signal, but in such a way as to shape the quantization noise produced by the delta-sigma modulator 52 into frequencies outside of a band of interest. It will be appreciated that even though two stages are illustrated and described, the delta-sigma modulator 52 can comprise more than two stages or a single stage. The number of stages and the filter coefficients determine the number and location of zeroes in the noise transfer function; in turn determining the shape and width of the low noise region.

A first stage comprises a first summer 54 and a first integrator 56. The first summer 54 receives an input signal and weighted feedback from the output of a second stage. The feedback signal is weighted by a scalar value at a first register 58. It will be appreciated that the scalar value associated with the first register 58, and any subsequent registers can be negative, such that the feedback signal is deducted from the input signal. The first summer 54 sums the received signals and passes the sum to the first integrator 56. The output of the first integrator 56 provides the input for a second stage.

The second stage comprises a second summer 60 and a second integrator 62. The output of the first integrator 56 is received at the second summer 60. The second summer 60 also receives a weighted, quantized, feedback from a quantizer 66. The feedback signal is weighted by a scalar value at a second register 64. The summed signals are passed to the second integrator 62. The output of the second integrator is passed to the quantizer 66, which converts the output of the integrator into a predetermined number of digital bits. In the illustrated embodiment, the output of the quantizer has a smaller digital word size than the input of the first summer 52.

The quantizer 66 is driven by a clock circuit 86 to produce its output at a selected sample rate. In an exemplary embodiment, the clock circuit can be a digital frequency synthesizer. The clock circuit 86 is controlled by a frequency control 88 that drives the clock circuit 86 to achieve a desired clock rate for the delta-sigma modulator 52 associated with a desired output frequency for the exciter 50. The frequency control can be made responsive to user input.

A delta-sigma modulator 52 provides one or more narrow high dynamic range frequency bands by shifting its associated quantization noise to out-of-band frequencies. The high dynamic range frequency bands associated with delta-sigma modulator 52 generally have center frequencies that are multiples of its clock rate. In an exemplary delta-sigma modulator, a center frequency of one high dynamic range band can be found at one-fourth of the clock rate. Thus, the position of these high dynamic range bands can be shifted across frequencies by changing the associated clock rate of the delta-sigma modulator 52.

The output of the quantizer 66 is then provided to a digital-to-analog converter 90. The digital-to-analog converter 90 is also driven by the clock circuit 86, such that it operates at the same rate as the delta-sigma modulator 52. The output of the digital-to-analog converter 90 is provided to a tunable filter 92. The tunable filter 92 attenuates signals having a frequency outside one or more passbands associated with the filter. Each of the filter passbands has an associated center frequency that can be altered in response to a control signal from the frequency control 88. This allows the system to react to changes in the frequency of the analog output from the digital-to-analog converter 90 by shifting one or more passbands.

The tunable filter 92 can comprise a bank of filters, each having a desired passband of interest. Alternatively, the tunable filter 92 can comprise a surface acoustic wave (SAW) filter that can electronically controlled to configure one or more micromechanical components that define its one or more associated passband frequencies. Other tunable filters having similar frequency agility can be utilized in accordance with one or more aspects of the invention. The output of the tunable filter 92 is a clean analog signal at a desired frequency that can be amplified and broadcast according to know methods.

Figure 4:
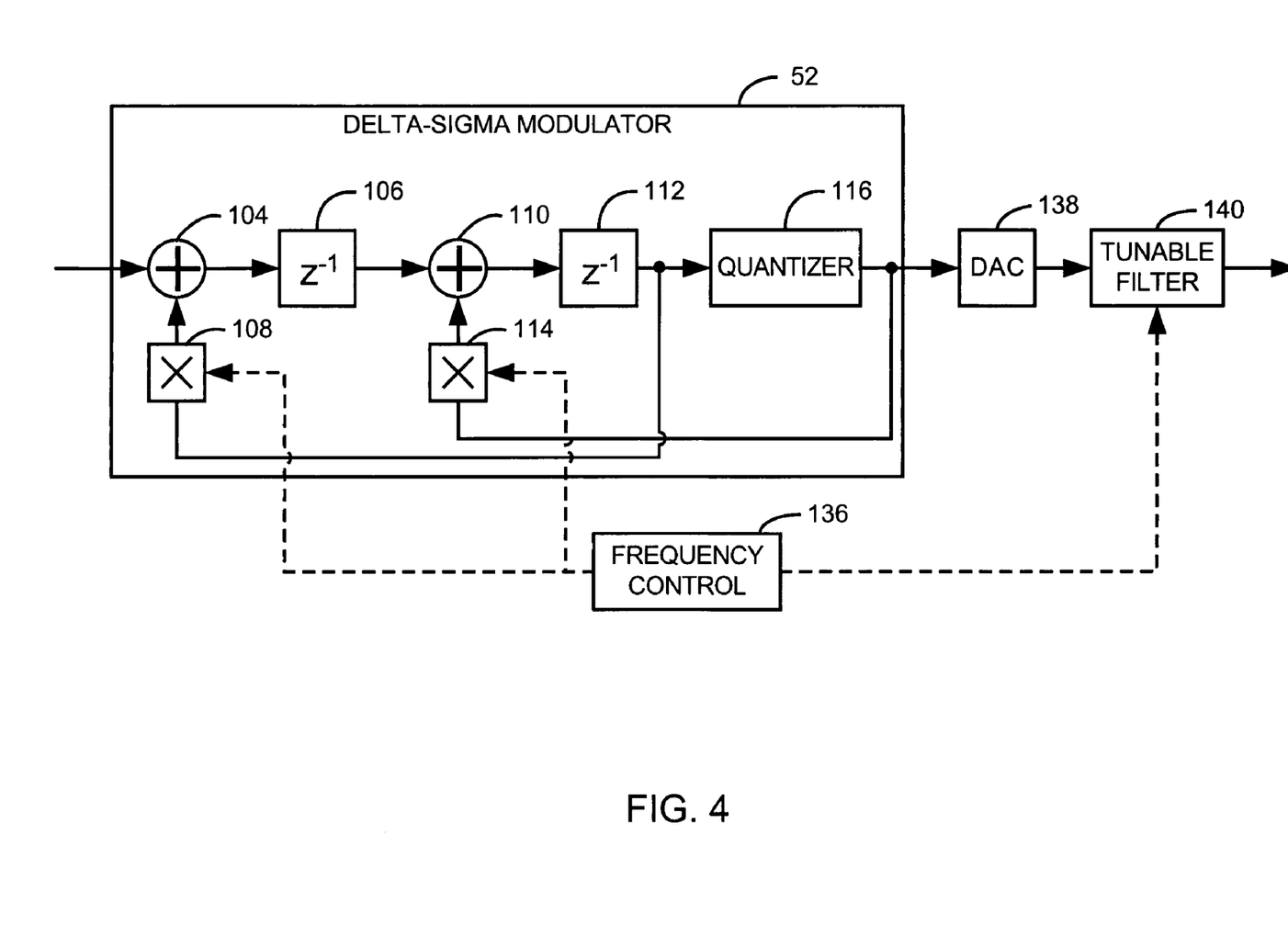
FIG. 4 illustrates a functional block diagram of another exemplary embodiment of an exciter in accordance with another aspect of the present invention.

FIG. 4 illustrates an exemplary embodiment of an exciter 100 in accordance with another aspect of the present invention. The exciter 100 comprises a delta-sigma modulator 102 that receives a digital input signal at a first word size and sample rate and outputs a modulated output signal having a second word size and sample rate. In the illustrated example, the first word size is twelve bits and the second word size is one bit. It will be appreciated that the digital input signal can be oversampled to produce an output signal at an increased rate, or frequency. For example, the delta-sigma modulator 102 and an associated digital-to-analog converter 138 can process the oversampled input at a high rate to directly produce radio frequency output without the need for upconversion of the signal.

The delta-sigma modulator 102 comprises one or more stages, limited only by practical considerations. The delta-sigma modulator 102 quantizes the input signal, but in such a way as to shape the quantization noise produced by the delta-sigma modulator 102 into frequencies outside of a band of interest. It will be appreciated that even though two stages are illustrated and described, the delta-sigma modulator 102 can comprise more than two stages or a single stage.

A first stage comprises a first summer 104 and a first integrator 106. The first summer 104 receives an input signal and weighted feedback from the output of a second stage. The feedback signal is weighted by a scalar value at a first register 108. It will be appreciated that the scalar value associated with the first register 108, and any subsequent registers can be negative, such that the feedback signal is deducted from the input signal. The first summer 104 sums the received signals and passes the sum to the first integrator 106. The output of the first integrator 104 provides the input for a second stage.

The second stage comprises a second summer 110 and a second integrator 112. The output of the first integrator 106 is received at a second summer 110. The second summer 110 also receives a weighted, quantized, feedback from a quantizer 116. The feedback signal is weighted by a scalar value at a second register 114. The summed signals are passed to the second integrator 112. The output of the second integrator is passed to the quantizer 116, which converts the output of the integrator into a predetermined number of digital bits. In an exemplary embodiment, the quantizer 116 performs a threshold determination to produce a one-bit output for the delta-sigma modulator 102. It will be appreciated, however, that the quantizer 116 can produce a multi-bit output in accordance with one or more aspects of the present invention.

A frequency associated with the digital output of the delta-sigma modulator can be altered by a frequency control 136. In accordance with an aspect of the present invention, the register at each stage (e.g, 108 and 114) is programmable such that the scalar value associated with the register can be altered by a control signal from the frequency control. In the illustrated delta-sigma modulator, the feedback registers essentially act as digital filter coefficients. Altering these coefficients directly shifts the frequency characteristic of the high dynamic range bands created by the delta-sigma modulator 102 by changing the "shape" of the quantization noise across the frequency spectrum. Thus, the width and dynamic range of a particular band can be changed by shifting the number of and the placement of one or more zeroes in the filter transfer function of the delta-sigma modulator. For example, the programmable coefficients can be altered to increase the dynamic range of a particular high dynamic range region by overlapping multiple low noise regions at a particular frequency.

The digital output of the delta-sigma modulator 102 is provided to a digital-to-analog converter 138, which converts the output into an analog signal. This analog signal is provided to a tunable filter 140. The tunable filter can comprise a filter bank, a micromechanically tunable SAW filter, or any other tunable filter known in the art. The tunable filter 140 is controllable by the frequency control 136 to adopt one or more passbands having center frequencies corresponding with the low noise bands of the delta-sigma modulator 102.

It will be appreciated that the various aspects of the invention illustrated in FIGS. 3 and 4 can be practiced in concert, as well as independently, to create a delta-sigma digital-to-analog converter having passbands with both a programmable center frequency and adaptable "shape" (e.g., passband width and dynamic range).

Figure 5:
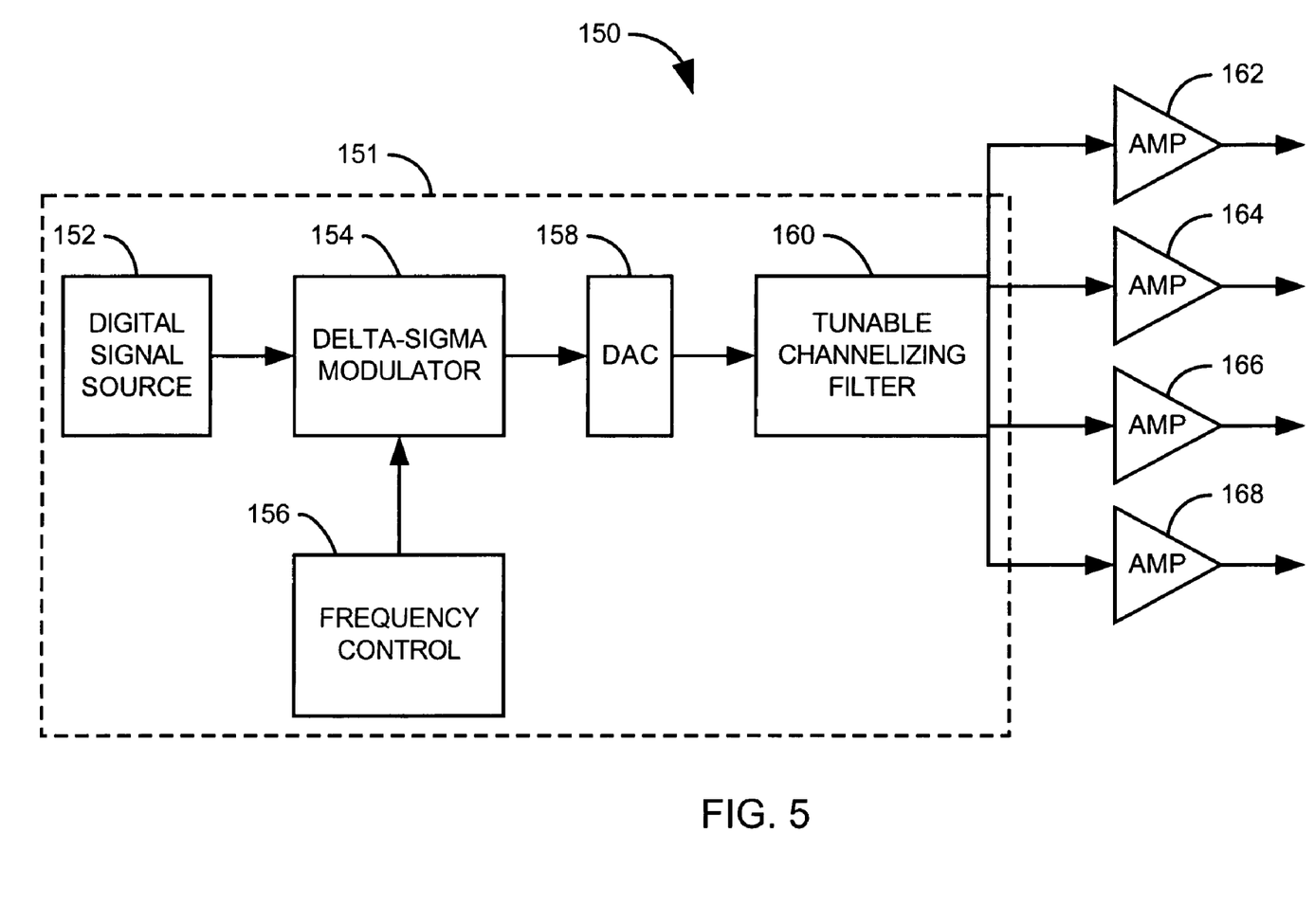
FIG. 5 illustrates a multi-carrier exciter in accordance with one or more aspects of the present invention.

FIG. 5 illustrates a transmitter system 150 comprising a multi-carrier exciter 151 in accordance with one or more aspects of the present invention. A digital signal source 152 provides a plurality of digital signals to a delta-sigma modulator 154. Each of the plurality of digital signals can have an associated frequency. In an exemplary embodiment, each of the associated frequencies can be found within a relatively narrow band of frequencies. The digital signal source 152 can be a direct digital synthesis device or any other appropriate digital signal processing circuit. The signal is filtered and quantized at the delta-sigma modulator 154 to bring the digital signals to respective radio frequencies. The respective radio frequency associated with each signal is determined by the spacing of the original associated frequencies. The DSM provides an average output frequency based on its architecture and clock rate. The delta-sigma modulator 154 can be frequency agile in accordance with one or more aspects of the invention such that one or more frequency characteristics of the delta-sigma modulator are controlled at a frequency control 156.

The output of the delta-sigma modulator 154 is provided to a digital-to-analog converter (DAC) 158. The digital-to-analog converter 158 converts the radio frequency digital signals from the delta-sigma modulator 154 into analog signals. The digital-to-analog converter can be programmable, in accordance with one or more aspects of the present invention, such that the frequency characteristics of the device can be altered at the frequency control 156. In an exemplary implementation of the invention, the output of the delta-sigma modulator 154 is a one-bit output, and the digital-to-analog converter 158 has one-bit of resolution. It will be appreciated, however, that both the output of the delta-sigma modulator 154 and the resolution of the digital-to-analog converter can be multi-bit in accordance with one or more aspects of the present invention.

The analog signals are provided to a channelizing filter 160, where they are filtered and separated into a plurality of individual carrier signals with respective radio frequencies. The channelizing filter 160 can have a plurality of narrow passbands, each having a center frequency associated with the respective radio frequencies of the analog signals. The channelizing filter 160 can be tunable, such that the center frequency or shape of the narrow passbands can be altered by the frequency control 156. In an exemplary implementation, the channelizing filter 160 is a surface acoustic wave filter that is electrically tunable via one or more micromechanical components within the filter. It will be appreciated, however, that any appropriate tunable filter or filter bank can be used in accordance with one or more aspects of the present invention.

The plurality of carrier signals are then provided to a plurality of amplifiers 162–168. In an exemplary embodiment, each of the plurality of carrier signals is provided to a different amplifier, but it will be appreciated that plural sets of signals can be provided to multi-carrier amplifiers. The amplifiers 162–168 amplify the provided signals and the amplified signals are provided to respective antennas (not shown) for transmission.

Figure 6:
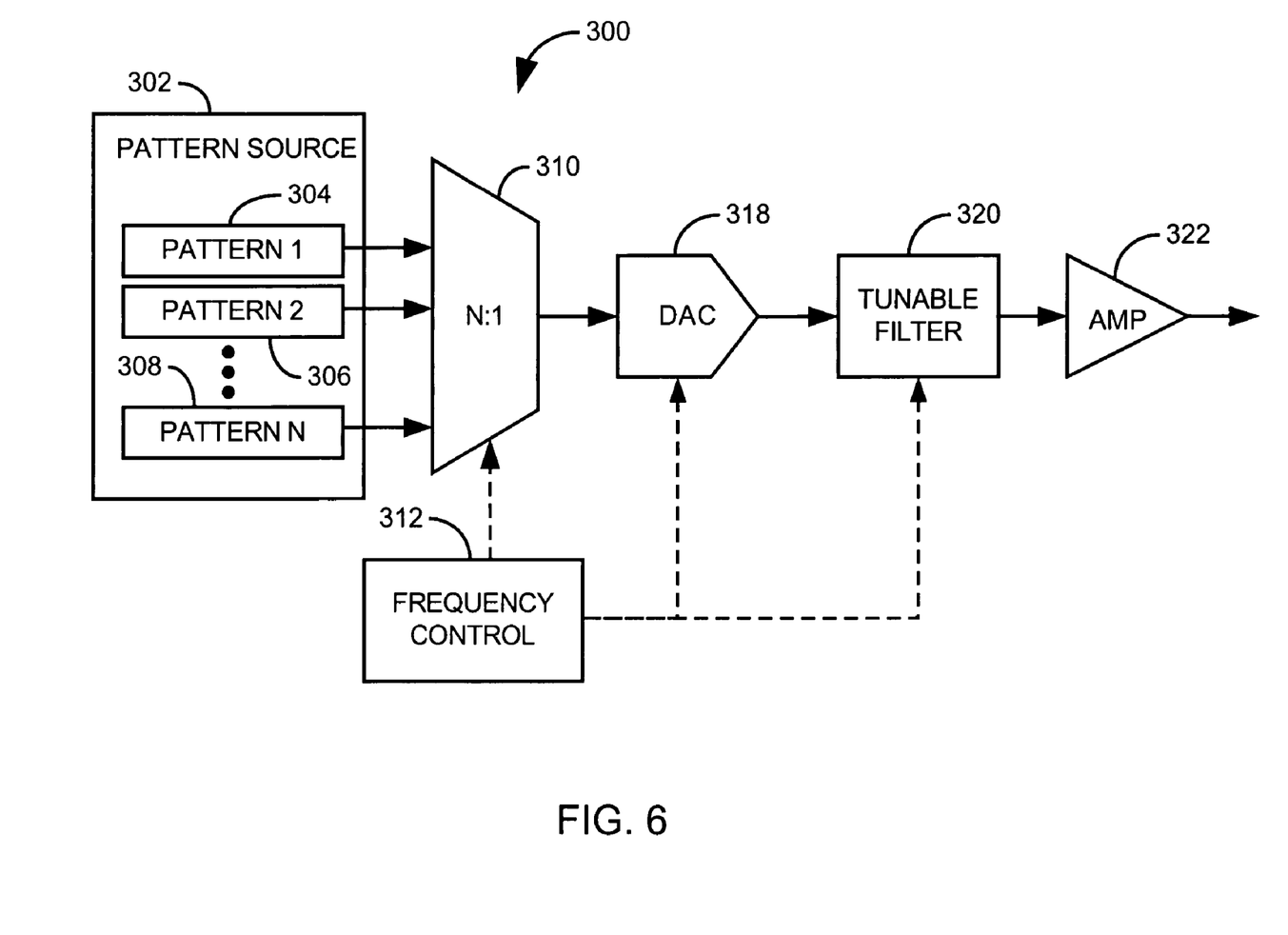
FIG. 6 illustrates an exemplary frequency agile digital synthesizer system in accordance with an aspect of the present invention.

FIG. 6 is an example of a frequency agile digital synthesizer system 300 in accordance with an aspect of the present invention. The system 300 includes a memory 302 that stores N predetermined signal patterns 304, 306, and 308, where N is an integer greater than 1. The signal patterns 304–308 can be stored as digital representations of corresponding analog signal patterns that have been generated for a predetermined duration at desired frequencies. Alternatively, the signals can be generated digitally, such as with a baseband modulator, DSP or other signal generator device. The frequency patterns 304–308 can be spaced over a desired frequency range, such as at fixed or variable intervals between adjacent frequencies. It is to be understood and appreciated that any set of frequencies, which can be related or unrelated, can be stored in the memory 302 for use in the system 300 according to an aspect of the present invention.

A switch system 310, such as a multiplexer, is associated with the memory 302 for selecting a desired one of the N frequency patterns 304–308. A frequency control 312 provides a selection signal for controlling which of the N patterns is to be provided to an associated digital-to-analog converter (DAC) 318. The selected pattern can be provided as an M-bit data stream, where $M \geq 1$. Those skilled in the art will understand and appreciate various types of frequency selection mechanisms that can be utilized to select a desired carrier frequency in accordance with an aspect of the present invention. For example, the frequency control function can be implemented as hardware, software or a combination thereof. In one particular example, the frequency selection can be computer-executable instructions implemented in the memory 302.

The DAC 318 converts the data stream into a corresponding analog signal having a desired frequency as defined by the selected pattern. The DAC 318 can also be controlled by the frequency control 312 to alter the shape or center frequency of a characteristic passband associated with the DAC 318. Where the system 300 is implemented within transmitter circuitry, the DAC 318 can provide the analog signal directly at a desired transmission frequency according to an aspect of the present invention. In this way, no additional analog upconversion is required prior to transmission of the filtered signal, and the system can provide a substantially pure carrier signal that can be mixed with desired data for subsequent transmission. Alternatively, the system 300 could be implemented in conjunction with receiver circuitry or other devices requiring substantially pure signals that can hop to desired frequencies according to a hop rate for such applications.

The DAC 318 provides the analog output signal to a tunable filter 320. The tunable filter 320 attenuates analog signals having a frequency outside of one or more characteristic passbands. The tunable filter is programmable, such that one or more frequency characteristics of its passbands can be electrically altered by the frequency control 312. For example, the frequency control can change associated center frequencies of one or more passbands of the filter. In an exemplary implementation, the tunable filter 320 is a surface acoustic wave filter that is electrically tunable via one or more micromechanical components within the filter. It will be appreciated, however, that any appropriate tunable filter or filter bank can be used in accordance with one or more aspects of the present invention.

The filtered signal is provided to an amplifier 322 operative to amplify the selected signal pattern to provide an output signal at a desired level. For example, the amplified signal can be provided as a local oscillator signal to drive a mixer such that the signal operates as a carrier frequency for transmission of wireless communication signals or for up or down conversion in a transceiver.

Figure 7:
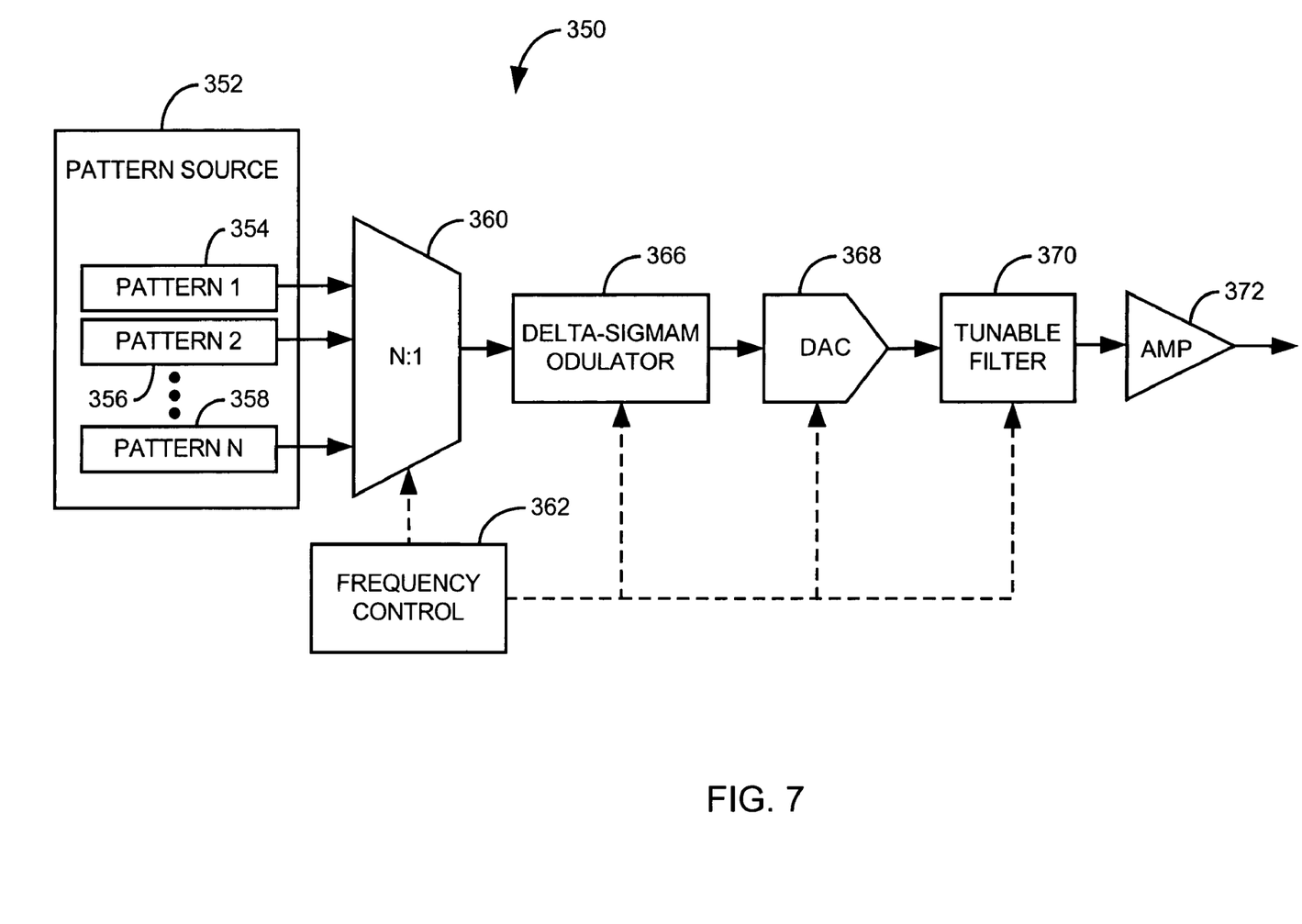
FIG. 7 illustrates another exemplary frequency agile digital synthesizer system in accordance with another aspect of the present invention.

FIG. 7 is an example of another digital synthesizer system 350 in accordance with an aspect of the present invention. The system 350 is similar to the system 300 shown and described with respect to FIG. 6, but makes use of a delta-sigma modulator within the digital-to-analog conversion. The system 350 includes a memory 352 that stores N predetermined signal patterns 354, 356, and 358, where N≧1. The signal patterns 354–358 can be stored as digital representations of corresponding analog signal patterns that have been generated for a predetermined duration at desired frequencies. Alternatively, the signals can be generated digitally, such as with a baseband modulator, DSP or other signal generator device. The frequency patterns 354–358 can be spaced over a desired frequency range, such as at fixed or variable intervals between adjacent frequencies. It is to be understood and appreciated that any set of frequencies, which can be related or unrelated, can be stored in the memory 352 for use in the system 350 according to an aspect of the present invention.

A switch system 360, such as a multiplexer, is associated with the memory 352 for selecting a desired one of the N frequency patterns 354–358. A frequency control 362 provides a selection signal for controlling which of the N patterns is to be provided to an associated delta-sigma modulator 366. The selected pattern can be provided as an M-bit data stream, where M≧1. Those skilled in the art will understand and appreciate various types of frequency selection mechanisms that can be utilized to select a desired carrier frequency in accordance with an aspect of the present invention. For example, the frequency control 362 can be implemented as hardware, software or a combination thereof.

The delta-sigma modulator 366 is programmed and/or configured to process a selected one of the signal patterns to provide a high dynamic range quantized data stream having a predetermined number of bits for driving an associated DAC 368 at a desired sample rate. The output data stream may be oversampled to provide a higher dynamic range. Those skilled in the art will understand and appreciate various approaches that can be utilized to implement a digital delta-sigma modulation in accordance with an aspect of the present invention. The delta-sigma modulator 366 provides a quantized output signal that typically has a reduced number of bits per sample when compared to the input signal, but at a faster sample rate than the input signal.

In accordance with one or more aspects of the present invention, the delta-sigma modulator 366 can be controlled by the frequency control 362 to change one or more frequency characteristics of the delta-sigma modulator. For example, delta-sigma modulators tend to shape quantization noise associated with the modulation process as to leave a few narrow bands of high dynamic range operation. The frequency control 362 can alter this shaping process to change one or more of the width, center frequency, and the associated dynamic range of the high dynamic range frequency bands. The process of adapting the delta-sigma modulator in this manner is described in more detail in the discussion of FIGS. 3 and 4 above.

The DAC 368 converts the delta-sigma modulated data stream into a corresponding analog signal having a desired frequency as defined by the selected pattern. The DAC 368 can be a one-bit or multi-bit DAC. A one-bit or low multi-bit DAC for converting a data stream can facilitate providing the analog output at a desired frequency, such as can be in the GHz or upper MHz range. For example, the DAC 368, delta-sigma modulator 366 and switch system can be configured from SiGe, InP or other high-speed integrated circuit technologies. The delta-sigma modulator 366 is configured to provide a data stream having an appropriate number of bits according to the DAC 368 being utilized.

The DAC 368 provides the analog output signal having the desired frequency to a tunable filter 370. In an exemplary embodiment, the DAC 368 can be configured by the frequency control 362 to operate at a desired frequency, such that an associated clock rate of the DAC 368 can be matched to the varying sample rate of a frequency delta-sigma modulator. Where the system 350 is implemented within transmitter circuitry, the DAC 368 can provide the analog signal directly at a desired transmission frequency according to an aspect of the present invention. In this way, no additional analog upconversion is required prior to transmission of the filtered signal, and the system can provide a substantially pure carrier signal that can be mixed with desired data for subsequent transmission. Alternatively, the system 350 could be implemented in conjunction with receiver circuitry or other devices requiring substantially pure signals that can hop to desired frequencies according to a hop rate for such applications.

The tunable filter 370 attenuates analog signals having a frequency outside of one or more characteristic passbands. The tunable filter is programmable, such that one or more frequency characteristics of its passbands can be electrically altered by the frequency control 362. For example, the frequency control can change associated center frequencies of one or more passbands of the filter. In an exemplary implementation, the tunable filter 370 is a surface acoustic wave filter that is electrically tunable via one or more micromechanical components within the filter. It will be appreciated, however, that any appropriate tunable filter or filter bank can be used in accordance with one or more aspects of the present invention.

The filtered output signal can be passed to an amplifier 372 operative to amplify the selected signal pattern to provide an output signal 374 at a desired level. For example, the amplified signal can be provided as a local oscillator signal to drive a mixer such that the signal operates as a carrier frequency for transmission of wireless communication signals or for up or down conversion in a transceiver.

Figure 8:
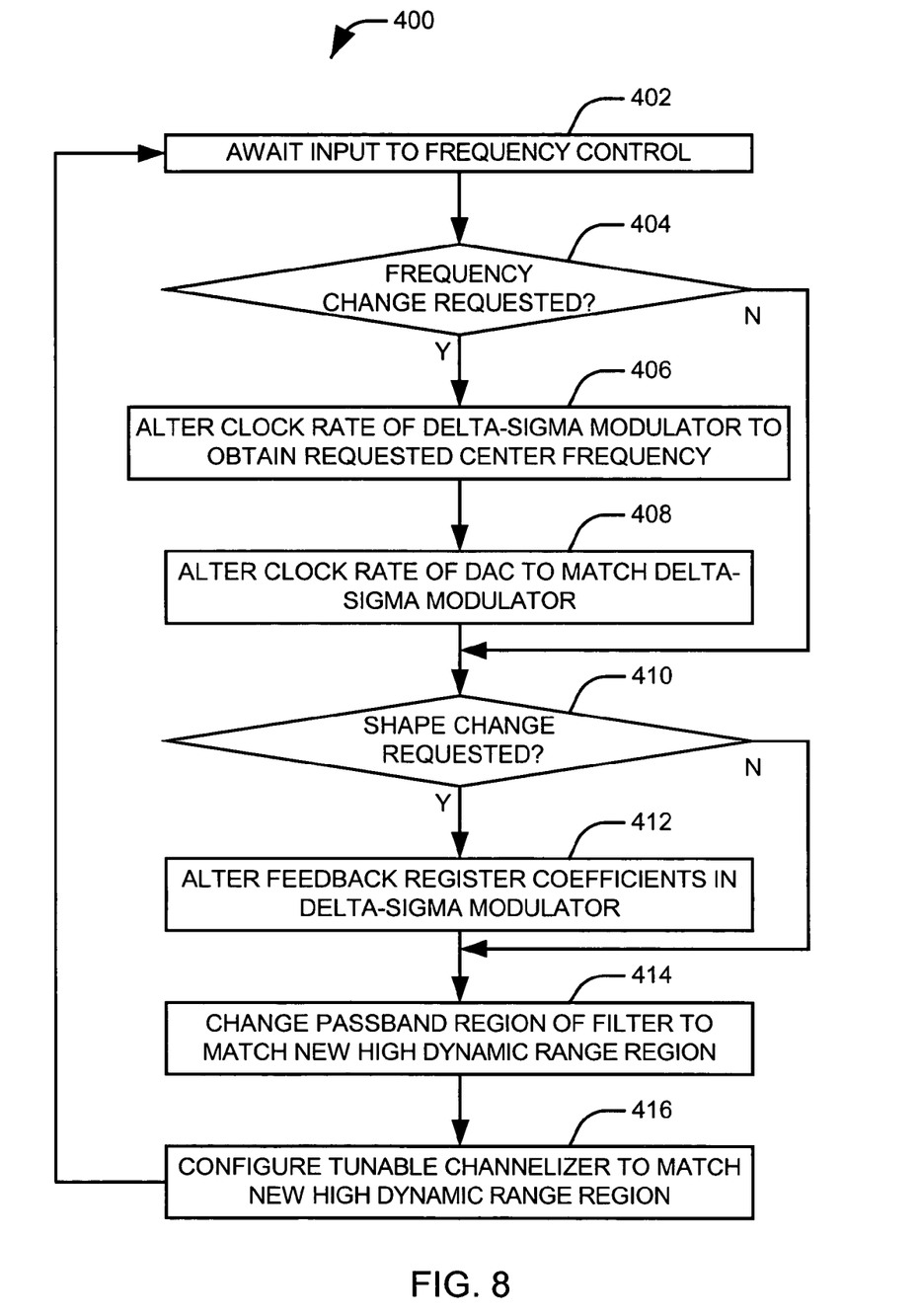
FIG. 8 illustrates a methodology for varying frequency characteristics of an exciter in accordance with one or more aspects of the present invention.

In view of the examples shown and described above, a methodology in accordance with the present invention will be better appreciated with reference to the flow diagram of FIG. 8. While, for purposes of simplicity of explanation, the methodology is shown and described as executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodologies can be implemented in hardware (e.g., one or more integrated circuits), software (e.g., running on a DSP or ASIC) or a combination of hardware and software.

FIG. 8 illustrates a methodology 400 for varying frequency characteristics of an exciter in accordance with one or more aspects of the present invention. The methodology begins at 402, where the system awaits an input to a frequency control. This input can originate from any of a number of sources, including, for example, configuration data from a user or an automated configuration message generated by signal processing components (not shown) upstream of the exciter. When the input is received, the system determines at 404 if it is necessary to change the center frequency of a digital-to-analog conversion (DAC) assembly associated with the exciter. If so, the clock rate associated with a delta-sigma modulator within the DAC conversion assembly is altered at 406 to produce a desired center frequency for one or more high dynamic noise regions associated with the DAC assembly. At 408, the clock rate associated with a digital-to-analog converter component within the DAC assembly is changed to match the clock rate of the delta-sigma modulator. The methodology then advances to 410.

If no change to the center frequency is necessary, the methodology proceeds directly to step 410. At 410, the system determines if it is necessary to change the shape of the one or more high dynamic range regions associated with the DAC assembly. For example, the width and effective dynamic range of the regions can be altered. If so, the methodology advances to 412, where one or more feedback registers within the delta-sigma modulator are altered to produce the desired shape. The methodology then advances to 414. If it is not necessary to change the shape of the high dynamic range regions, the methodology advances directly to 414.

At 414, an analog filter on the exciter is configured such that one or more passbands on the filter coincide with the desired high dynamic range region of the DAC assembly. This can include changing the center frequency of the filter passbands as well as changing their effective width. At 416, a tunable channelizer on the exciter is configured to match the desired high dynamic range of the DAC assembly. Once the filter and channelizer passbands have been configured, the methodology returns to 402 to await further configuration input at the frequency control.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A frequency agile exciter assembly, comprising:
   a delta-sigma modulator, having associated frequency characteristics, that produces a digital output signal;
   a digital-to-analog converter that converts the digital output signal into an analog signal;
   a clock circuit that provides a clock signal to the delta-sigma modulator and the digital-to-analog converter; and
   a frequency control that controls at least one of the clock circuit, the delta-sigma modulator, and the digital-to-analog converter to alter the frequency characteristics of the delta-sigma modulator.

2. The assembly of claim 1, the frequency control controlling the clock circuit to alter respective center frequencies of at least one high dynamic range region associated with the delta-sigma modulator.

3. The assembly of claim 2, the delta-sigma modulator comprising at least one feedback register and the frequency control being operative to alter at least one scalar value associated with the at least one feedback register to change respective widths of at least one high dynamic range region associated with the delta-sigma modulator.

4. The assembly of claim 2, the delta-sigma modulator comprising at least one feedback register and the frequency control being operative to alter at least one scalar value associated with the at least one feedback register to change respective dynamic ranges of at least one high dynamic range region associated with the delta-sigma modulator.

5. The assembly of claim 1, the delta-sigma modulator comprising at least one feedback register and the frequency control being operative to alter at least one scalar value associated with the at least one feedback register to change respective widths of at least one high dynamic range region associated with the delta-sigma modulator.

6. The assembly of claim 1, the delta-sigma modulator comprising at least one feedback register and the frequency control being operative to alter at least one scalar value associated with the at least one feedback register to change respective dynamic ranges of at least one high dynamic range region associated with the delta-sigma modulator.

7. The assembly of claim 1, the delta-sigma modulator outputting a one-bit digital signal.

8. The assembly of claim 1, further comprising a tunable filter having at least one passband having a center frequency, the frequency control being operative to vary the center frequency of the at least one passband.

9. The assembly of claim 8, the tunable filter comprising a surface acoustic wave (SAW) filter.

10. The assembly of claim 8, the tunable filter comprising at least one micromechanical structure that can be electrically configured to change the center frequency of the at least one passband associated with the filter.

11. The assembly of claim 1, the analog signal being a radio frequency signal.

12. The assembly of claim 1, the analog signal comprising a plurality of analog signals having respective associated frequencies, the assembly further comprising a channelizing filter that separates and filters the plurality of analog signals.

13. The assembly of claim 12, the frequency control being operative to vary the center frequencies of a plurality of passbands associated with the channelizing filter.

14. The assembly of claim 13, the channelizing filter comprising a surface acoustic wave filter comprising at least one micromechanical structure that can be electrically configured to change the center frequencies of plurality of passbands associated with the filter.

15. A digital frequency synthesizer having frequency agility, comprising:
   a digital-to-analog converter that receives a digital input signal and outputs an analog signal having an associated frequency;
   a tunable filter, having at least one passband with a respective central frequency, that filters the analog output signal; and
   a frequency control that is operative to alter the respective central frequencies of the at least one passband and one or more frequency characteristics of the digital-to-analog converter.

16. The digital frequency synthesizer of claim 15, the frequency control being operative to alter one or more frequency characteristics of the digital-to-analog converter.

17. The digital frequency synthesizer of claim 16, the tunable filter being a surface acoustic wave filter.

18. The digital frequency synthesizer of claim 17, the surface acoustic wave filter being electrically tunable via micromechanical structures within the filter.

19. The digital frequency synthesizer of claim 15, the digital input signal being a delta-sigma modulated digital signal.

20. A method of providing a frequency agile delta-sigma digital-to-analog converter (DAC), comprising:
   altering at least one frequency characteristic associated with a delta-sigma modulator; and
   configuring a tunable filter to an appropriate passband according to the frequency characteristics of the delta-sigma modulator.

21. The method of claim 20, the altering of at least one frequency characteristic including changing at least one programmable register within the DAC.

22. The method of claim 20, the altering of at least one frequency characteristic comprising altering a clock rate associated with the delta-sigma modulator and the method further comprising altering a clock rate associated with a digital-to-analog converter to match the clock rate of the delta-sigma modulator.

23. The method of claim 20, the altering at least one frequency characteristic further comprising converting the digital output of the delta-sigma modulator into an analog signal and summing the analog signal with a delayed representation of the analog signal.

24. The method of claim 20, the configuring of the tunable filter including electrically changing micromechanical structures within the filter.

25. A frequency agile exciter, comprising:
   means for converting a signal from a digital signal to an analog signal, the means having associated frequency characteristics;
   means for altering the associated frequency characteristics of the means for converting.

26. The exciter of claim 25, further comprising means for filtering the analog signal, the means having associated frequency characteristics.

27. The exciter of claim 26, the means for altering being operative to alter the frequency characteristics of the means for filtering.

* * * * *